(12) United States Patent
Driller et al.

(10) Patent No.: US 6,191,597 B1
(45) Date of Patent: *Feb. 20, 2001

(54) PRINTED CIRCUIT BOARD TEST DEVICE WITH TEST ADAPTER AND METHOD FOR ADJUSTING THE LATTER

(75) Inventors: Hubert Driller; Paul Mang, both of Schmitten (DE)

(73) Assignee: Mania GmbH & Co., Weilrod (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/619,662
(22) PCT Filed: Feb. 23, 1995
(86) PCT No.: PCT/EP95/00662
§ 371 Date: Sep. 11, 1996
§ 102(e) Date: Sep. 11, 1996
(87) PCT Pub. No.: WO95/23340
PCT Pub. Date: Aug. 31, 1995

(30) Foreign Application Priority Data

Feb. 28, 1994 (DE) ................................................. 44 06 538

(51) Int. Cl.⁷ .............................. G01R 1/06; G01R 31/02
(52) U.S. Cl. ........................... 324/758; 324/754; 324/761
(58) Field of Search ................................... 324/754, 758, 324/761

(56) References Cited

U.S. PATENT DOCUMENTS

| | | | |
|---|---|---|---|
| 4,820,975 | 4/1989 | Diggle | 324/158 F |
| 4,843,315 | 6/1989 | Bayer et al. | 324/756 |
| 4,963,822 | * 10/1990 | Prokopp | 324/758 |
| 5,225,777 | 7/1993 | Bross et al. | 324/754 |
| 5,394,099 | * 2/1995 | Kazama | 324/754 |
| 5,575,076 | * 11/1996 | Creeden | 324/758 X |
| 5,898,313 | * 4/1999 | Cugini | 324/758 |

FOREIGN PATENT DOCUMENTS

| | | |
|---|---|---|
| 29 33 862 | 3/1981 | (DE) . |
| 31 10 056 | 9/1982 | (DE) . |
| 33 11 977 | 10/1984 | (DE) . |
| 33 40 178 | 5/1985 | (DE) . |
| 233 427 | 2/1986 | (DE) . |
| 39 09 284 | 9/1990 | (DE) . |
| 41 07 387 | 9/1992 | (DE) . |
| 43 02 509 | 8/1993 | (DE) . |
| 0 473 363 | 3/1992 | (EP) . |
| 2086670 | 5/1982 | (GB) . |
| 61-38575 | 2/1986 | (JP) . |
| 61-76367 | 5/1986 | (JP) . |
| 62-240871 | 10/1987 | (JP) . |
| 63-151872 | 6/1988 | (JP) . |
| 64-25069 | 1/1989 | (JP) . |
| 91/19392 | 12/1991 | (WO) . |

* cited by examiner

Primary Examiner—Glenn W. Brown
(74) Attorney, Agent, or Firm—Wenderoth, Lind & Ponack, L.L.P.

(57) ABSTRACT

Method and apparatus for setting the contact elements (test pins) of a printed circuit board test device, which are accommodated in one or two test adapters, to the contact points, provided on one or both sides, of a printed circuit board (series) to be tested, wherein said printed circuit board (series) comprises various subsets of contact points and suitable alignment means with respect to the adapters, in particular two reference holes or reference edges. The new and inventive feature is considered to consist in the fact that at least one subset of the contact elements (S) of one or both adapters (BF, BA; TF, TA), independently of at least one further subset of the contact elements (H), and the alignment means (T) of one or both adapters are set relative to one another.

32 Claims, 2 Drawing Sheets

PRINTED CIRCUIT BOARD TEST DEVICE WITH TEST ADAPTER AND METHOD FOR ADJUSTING THE LATTER

BACKGROUND OF THE INVENTION

The present invention relates to a printed circuit board test device with a test pin adapter and to a method for adjusting or positioning the latter. This technology is used to connect the standard basic contact grid of an electronic test apparatus for testing single layer or multi-layer board-type interconnection substrates, such as printed circuit boards, ceramic substrates and the like, to the contact points of the substrate, such as a printed circuit board, to be tested. The contact points of the substrate are in the form of very small and very densely arranged metal contact areas or pads on one or both surfaces of the test specimen for SMD components (i.e. surface mounted components) and/or contact holes (plated-through holes) for "wired" components. The printed circuit boards generally are not yet loaded with such active electric/electronic components. It must be pointed out in this connection that the adapters currently preferred are so-called test pin adapters having therein test pins. Such adapters are used in printed circuit board test devices both for single-sided and for double-sided testing of printed circuit boards. However, other types of "contact elements" are also conceivable, such as so-called "vertical conductor rubber plates", i.e. for example rubber mats with contact wires finely distributed therein and disposed at right angles to the surface, or similar elastic mats which become electrically active upon application of local pressure, such are known in the prior art.

With regard to the testing of unloaded printed circuit boards, the limit of testability thereof was determined in the past mainly by the configuration possibility of the contact test pins in the adapter and by the contact density of the bonding pad (basic grid) of the printed circuit board test device. In keeping with the ever increasing miniaturization of electronic components, there has however occurred every year a further reduction in size of the electric interconnections and contact points and their density on the printed circuit boards to be tested. At the same time, the size of panels has had to be increased for utility-based production to relatively large standard formats, i.e. the standard formats contain a number of identical printed circuit boards or printed circuits, in order thereby to optimize the economic return on the manufacture of the latter.

There therefore arises on an ever increasing scale the problem that the test pins in a supporting element of the adapter cannot be positioned sufficiently accurately in relation to the connecting structures (connecting areas, pads, holes) of the printed circuit board. This gives rise in many cases to defective and/or wrong contact between the contact elements and the connecting structures. These defective contacts make a reliable electrical test of the printed circuit boards extremely difficult or even impossible.

The causes of this problem lie (albeit on a reduced scale) in the adapter and above all in the test specimen or printed circuit board itself. The influence of the adapter on the deviation of the contact points from a target value results both from tolerances during the manufacture of the various components of the adapter and from the requisite clearance between, e.g., the test pins and guides provided for the latter, e.g. a number of drilled plexiglass plates as supporting elements of the adapter. This is exemplified in the following table.

| Accuracies of typical test adapters (excluding the influence of temperature during testing) | |
|---|---|
| Deviation of the position of a tip of a contact element relative to the center of guide element | ±20 μm/±0.8 mil |
| Overall clearance between guide element and guide hole | ±25 μm/±1.0 mil |
| Positional tolerance of guide hole | ±05 μm/±2.0 mil |
| Total overall deviation | ±50 μm/±2.0 mil |

Herein, the term "mil" means a thousandth of an inch. This unit of length has acquired general acceptance in the printed circuit board industry and amounts to 0.0254 mm.

The influence of temperature during the manufacture and use of the adapter can be limited relatively easily by air conditioning. Such influence can therefore be excluded from further consideration.

Far more difficult to control are differences in the geometric structures on the test specimen, i.e. on the printed circuit board to be tested. These differences can be divided into relative positional displacements of an entire image, which can be attributed to recording errors during an exposure process, and to distortions within the image, which can arise through irreversible thermal processes of the test specimen or of a film used for exposure of the printed circuit. By virtue of the sequence of production processes (drilling, exposure, hot tinning, etc.), there are at least four mutually independent sources of error affecting the exact position of conductors and points of connection on the printed circuit board. Thus, the holes in the printed circuit board, the surface structure of the underside of the board, the surface structure of the top side of the board, and the outer contour of the board are four mutually independent overall structural factors. Each of these overall structures of factors possesses its own peculiar distortion/deformation properties affecting the overall geometry of the object, i.e. the board. The orientation of the overall structures to one another can be relatively described or defined by displacement/distortion in X- and Y-directions and by rotation. For an individual printed circuit board in a panel, the distortions can be represented with sufficient accuracy as pure displacements and rotations.

Typically, a "mixed technology" is employed in printed circuit boards. In the latter, both wired components for connection to contact holes and surface-mountable (SMD) components for connection to contact areas or pads are provided on a printed circuit board. The need for this mixed technology is due to the fact that a number of electronic components such as, e.g., processors in high-pole PGAs (pin grid arrays) are not obtainable in surface-mounted form. Economic considerations or other technical factors also lead to use of this mixed technology. Printed circuit boards manufactured for purely surface mounting can be aligned by means of conical reference pins for which the optimum position has been determined manually or optically. This type of alignment, however, does not work for a large proportion of printed circuit boards with the above-mentioned mixed technology, because the large number of conical test pins/contact elements provided for the contacting of contact holes, when they are pressed against the test specimen, unintentionally displace the test specimen into a false position, and hence cancel out the adjusting effect of the reference pins.

EP-A-0 508 561 Al shows an apparatus for electronically testing printed circuit boards including a plurality of generally parallel test pins, each of which has a section of reduced diameter along its length intermediate the ends thereof, with a plate having a plurality of drilled holes in which the test pins are mounted with the reduced diameter portions being located in the holes. The plate is adapted to interfere with shoulders at the ends of the sections of reduced diameter to retain the test pins in the testing apparatus. Any displacement of the test pins relative to each other (if any) takes place only in the axial direction thereof. There is no movement whatsoever of any of the test pins relative to each other in a direction parallel with the printed circuit board, let alone for the purpose of compensating for any production errors in the exact location of any of the contact areas on the printed circuit boards to be tested.

U.S. Pat. No. 5,225,777 discloses a high density test probe assembly and method of fabrication thereof. The probe assembly has a multitude of wire-like probe elements whose exposed tips are spaced on X and Y centers to match the centers of closely spaced surface pads of a VLSI circuit. Interconnections to and from the probe elements (for connection to external test equipment) are provided by a multi-layer arrangement of insulating and conducting layers within the body of the probe assembly. The tips of the probe elements are canted relative to vertical so that when the probe assembly is pushed down into mating position onto a VLSI circuit, the probe elements uniformly deflect laterally in one direction only and give a "wiping" action on contact surface pads of the VLSI circuit together with a desired normal contact force. This prior art reference does not mention the problem of laterally offset contact areas or pads on the object to be tested due to unavoidable production tolerances.

BRIEF DESCRIPTION OF THE DRAWINGS

An embodiment of the invention will be discussed in detail in the following detailed description, with reference to the accompanying drawings, wherein.

DETAILED DESCRIPTION OF THE INVENTION

Figure 1:
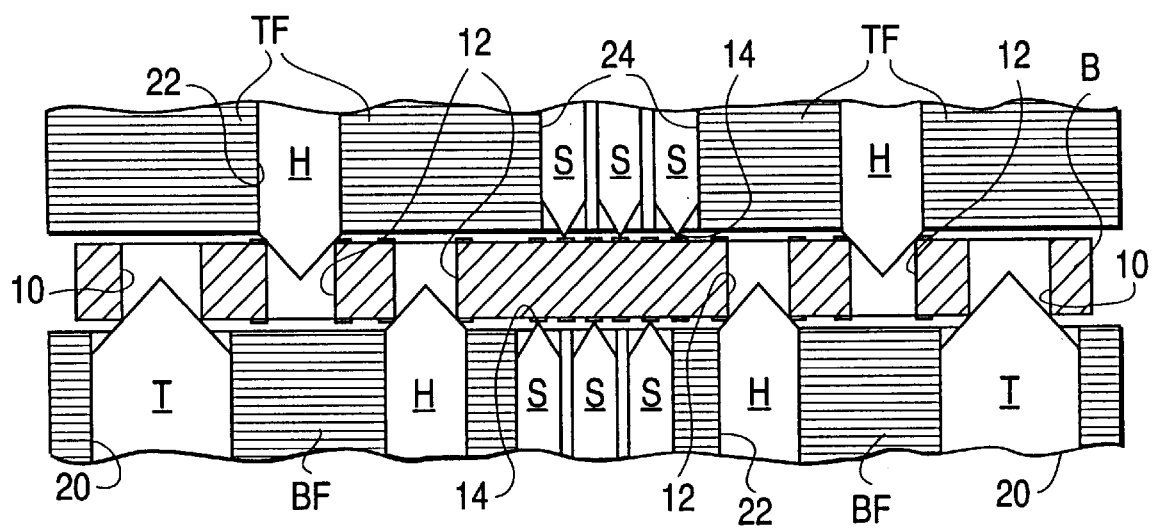
FIG. 1 is a schematic cross-sectional view showing a conventional arrangement of contact elements/test pins.

FIG. 1 shows the theoretically intended arrangement of contact elements or test pins during the double-sided testing of a printed circuit board B which is being tested by a conventional adapter. The printed circuit board B is held in position by reference pins T fitting into reference holes 10. Plated-through holes 12 are contacted by relatively massive test pins H, and very small, closely arranged contact areas or pads 14 on the board are contacted by thin, very closely arranged test pins S.

Figure 2:
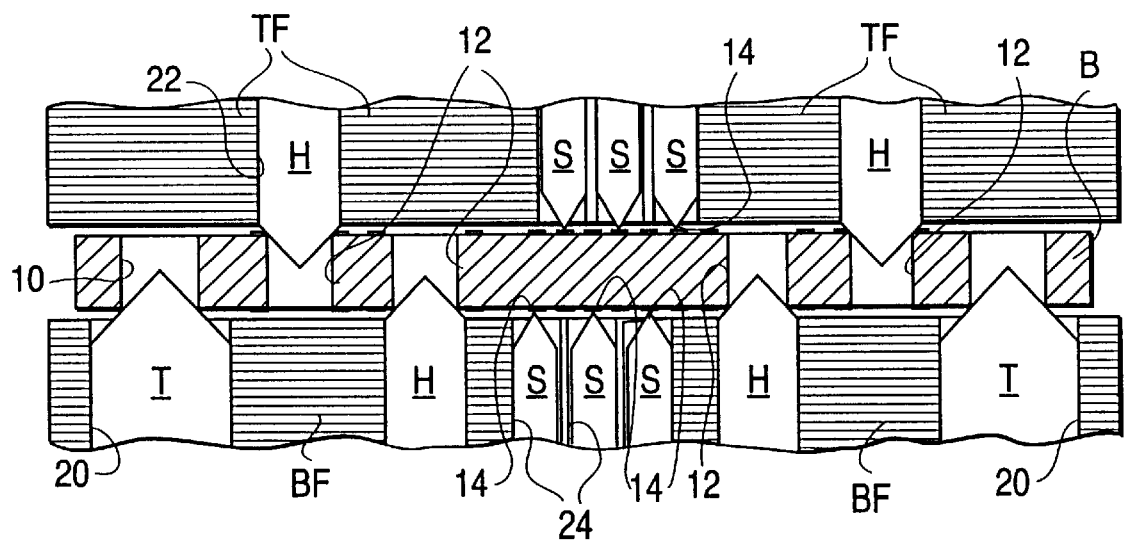
FIG. 2 is a similar view but showing misalignment problems that occur therein.

FIG. 2 shows a defective alignment resulting from unavoidable fabrication inaccuracies during the manufacture of the reference pins, the test pins and the printed circuit board B to be tested. A more or less large number of pins S in proportion to very small contact areas 14 for SMD components assigned thereto results in correspondingly defective contacts of the test pins S if the conventional adapter technology is used. The holes in the printed circuit board B (for forming at least two reference holes 10 for the reference pins T and the in most cases very numerous through-plated holes 12 for the test pins H) are produced in a different operating cycle than the "printed circuit", including the contact areas 14 for the SMD components. Thus, it is impossible in practice, despite adequate miniaturization of the connecting structures on the printed circuit board B to be tested, to prevent the holes 10, 12 and the printed circuit together with the contact areas 14 from undergoing a major unintentional displacement relative to one another. This leads to the defective contacting, shown in FIG. 2, of one or more contact areas 14 by respective test pins S, which results in corresponding measurement errors in the testing of the printed circuit board B if the conventional adapter technology is used.

The defective alignment described above is however not caused simply by the possible defective alignment of the holes relative to the printed circuit, but to a large extent also by the fact that, by virtue of the production process for manufacturing the printed circuit, the latter deviates in the final analysis from its theoretically determined or intended position and dimension, i.e. it is applied to the board B inherently deformed or distorted or askew. Guide holes 20, 22, 24 for the pins T, H and S in the adapter plates or boards TF and BF (TF=top fixture or adapter and BF=bottom fixture or adapter) cannot be produced to take account such accidentally occurring deviations and/or are themselves subject to certain fluctuations/tolerances in their positions. Thus, it becomes clear that, with this conventional adapter technology, with increasing miniaturization of the printed circuit boards to be tested, and with the increasing density in particular of the contact areas or pads 14 for SMD components, it is becoming increasingly difficult or even impossible to achieve a sufficiently accurate contacting simultaneously at all contact points of the printed circuit boards to be tested.

A further cause for the defective contacting of the printed circuit board to be tested, which is frequently observed with conventional adapters despite the supposed fixing of the latter in a predetermined position by the reference pins T, is based on the fact that during the pressing of the printed circuit board during a test operation onto the possibly very numerous test pins H, the latter in certain circumstances simply cancel out the intrinsically provided and intended alignment effect of the reference pins T. That is, the exact position of the individual test pin H provided with a conical point, which engages with the through-plated hole 12, is naturally also subject to certain fluctuations. This is not only in relation to the respective position of the holes 22 accommodating the pins H, but also because the conical points of pins H are by no means always accurately disposed centrally. Thus, the actual position of the printed circuit board B, when the printed circuit board is in the pressed state for a test operation, is determined very much more by the large mass of the test pins H than by the, in most cases, two reference pins T and hence is also somewhat accidental.

Figure 3:
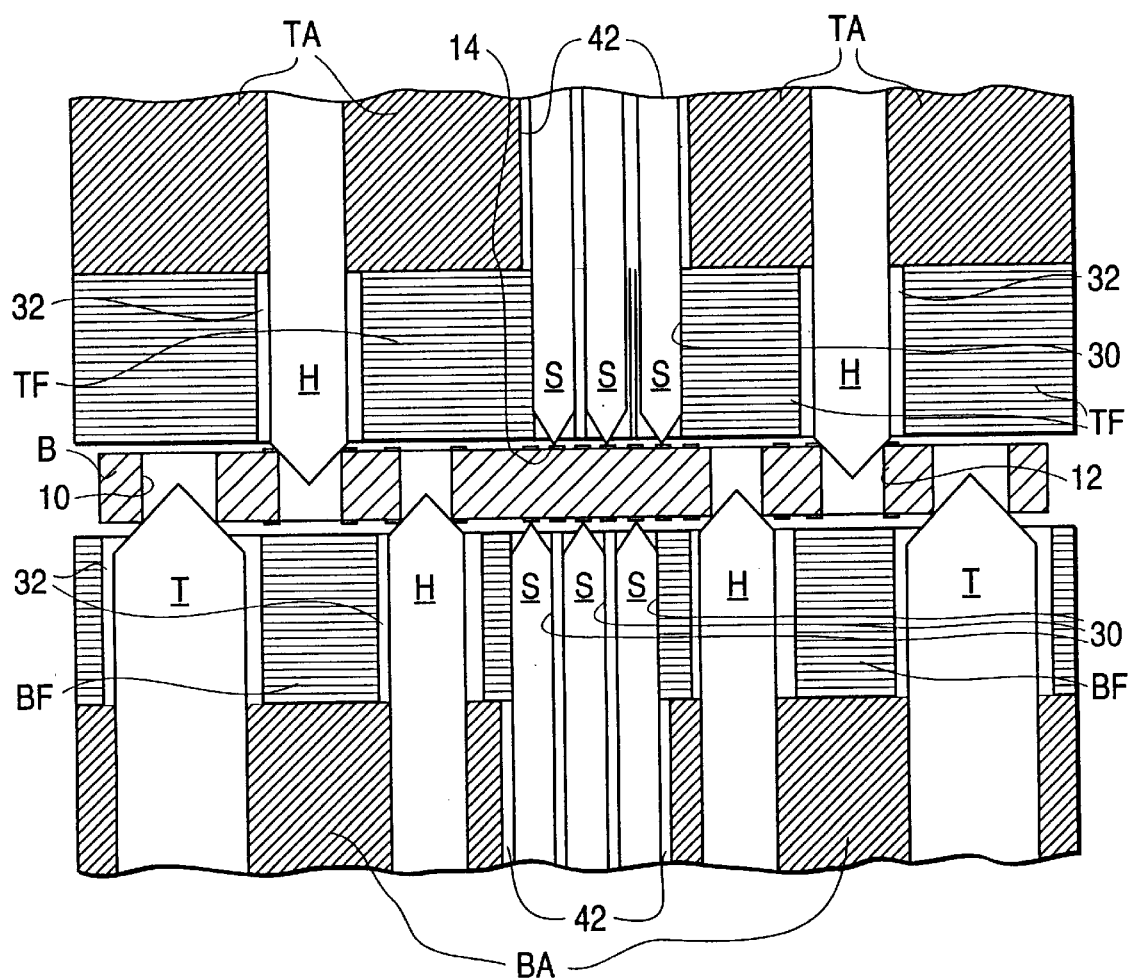
FIG. 3 is a similar view but of the arrangement of the present invention.

A solution to this problem will be explained with reference to FIG. 3, which shows a possible embodiment of the invention in the form of a printed circuit board test device with novel test pin adapters on the top side and underside of a test specimen B. This solution utilizes a plurality of sections of the supporting elements, which sections, e.g. subdivided into various planes and disposed on one particular side of the test specimen B, are, e.g., in the form of adapter plates which are freely positionable independently of one another relative to the test specimen within limited regions relative to the test specimen. FIG. 3 thus shows the essence of the novel adapter technology, which is distinguished above all by the fact that the test pins S for the contacting of the very small and densely arranged surface contacts 14 for SMD components on the printed circuit board are accommodated in holes 30 in a section BF or TF of a guide element or adapter board BF or TF, that is displaceable by a significant dimension parallel with the plane of the printed circuit board B with respect to the test pins H and the reference pins T, and hence to the test specimen B itself. This displacement dimension must be at least equal to the greatest anticipated defective alignment of the test pins S relative to respective surface contacts 14 of the printed circuit board to be tested assigned thereto.

The spacing of the various sections of the supporting element (e.g. of the guide plates of a test pin adapter) should take into account both the accuracy requirements of the test pins guided by the guide plates and of the mechanical stability properties of the test pins. The more slender and hence more flexible test pins S for connection to the contact areas or pads 14 are accommodated in the section BF or TF of the supporting element (guide plate of the test pin adapter) which lies closest to the printed circuit board B. Thus, the positioning of these contact elements/test pins S requires, by virtue of the high contact density of small contact areas 14 and the high flexibility of the thin test pins S, the greatest possible accuracy.

Contact elements H to contact plated holes 12, for connection with wired components, extend through enlarged holes/vacancies 32 in sections BF and TF, with dimensions enlarged to such an extent that a lateral movement of contact elements H within the required tolerances is possible. The great stability of these typically more stable contact elements H, combined with the self-centering of the conical tips thereof fitting in holes 12 of the test specimen, permit guiding without difficulty of elements H by independent, further removed sections BA and TA of the supporting elements. The contact elements S for the pads 14, which of necessity penetrate this second section BA or TA of the supporting element on the respective printed circuit board side, are guided through enlarged holes/vacancies 42 in a similar manner, so that an independent precision positioning is possible.

For the positioning of the test specimen B in the adapter, reference holes 10 are produced simultaneously with the standard drilling process for through-plated holes 12. The alignment means (e.g. reference pins T) required for pre-centering during manual or automatic insertion of the printed circuit board to be tested is supported by the same support plate or section BA, TA used for supporting test pins H the contacting of terminals for wired components. This is possible if all the holes in the printed circuit board B, including the reference holes 10, possess a common distortion and displacement.

In special cases the reference holes 10 are produced together with the milling of the outer contour of the board as a last production step thereof. In this case, it may be necessary to provide a further support element section for positioning the reference pins, independently of the other sections supporting the test pins. In any case, it is recommended that a steadily pressed-in barrel be used for defining holes 10 for guiding the reference pins. Such a barrel, typically reaching close to the test specimen, prevents lateral spreading/warping of this alignment means (reference pin) despite necessary clearance for vertical movement, normally supported by a spring, of the reference pin. Although reference holes produced together with the outer contour of the board on accuracy grounds in special cases in the past theoretically exhibit better accuracy by virtue of the absence of a plated-through hole barrel, the use of plated-through reference holes is nevertheless to be recommended, because the overall work-load for the testing is reduced and the collection of the many contact elements with typically conical tips for contacting the terminals for wired components permits a substantially better centering. The law of large numbers operates here, and produces for the overall positioning accuracy the mean value of the distribution frequency, contingent on manufacturing tolerances, around the target positioning value. In mathematical terms there is obtained as the probable deviation the statistical error of the mean value. Consequently, the differences produced by slightly varying wall thicknesses of the plated-through barrels are more than offset.

Two methods can be used in principle for determining the position for the alignment of the support plates by alignment of contact elements.

The simplest and first method involves common positioning for a lot. This method can only be used effectively, however, if fluctuations in the distortions/displacements occurring within a lot are small compared with the total deviation to be corrected. Elaborate measuring and subsequent positioning is inappropriate in this case. For the test specimens at the extreme edge of a contact point position error distribution curve, there will then be added as a follow-up to the test of the lot an additional labor and time intensive phase in which printed circuit boards exhibiting faults (typically breaks) are tested with manually optimized displacement values.

In a second method, alignment takes place for each individual printed circuit board. To enable optimum displacement values to be set directly for each test specimen in a first test, optical measuring devices, e.g. such as CCD cameras, are generally used. These cameras measure the position of marks which are provided on the board. These marks are present on almost all test specimens, so that fully automatic loading devices used later can load a printed circuit board later with surface mounted components. This means thereof that a special measuring apparatus or station is required, which prior to the printed circuit board test proper measures the displacement of the printed circuit of each board by graphic elements in the image of the printed circuit board.

In the double-sided testing of printed circuit boards as mentioned above, very many degrees of freedom for errors of position exist. A corresponding number of cameras have to be used for this second method. There are employed as a minimum two cameras on each side of a printed circuit board to be tested, to determine for each side the actual orientation in three degrees of freedom (X- and Y-axes, angle). In practice these cameras cannot be accommodated in the test adapted, even with extreme miniaturization, since the optical recording marks lie very close to or between the contact points to be tested. A remedy is provided by the above-mentioned special measuring apparatus or station, in which the test specimens are measured optically prior to the test proper. This measurement can be carried out in the simplest manner in a fully automatic test system, because then the test specimens can pass through a synchronously operated twin station, in which in the first station measurements are made and in the second station (the test adapter) testing is carried out with optimum positioning with the displacement values previously determined. In the measuring station there can be used per side either one camera positionable freely in X/Y directions or two cameras viewing through exact positioning holes in an adapter. The first arrangement increases the mechanical outlay on the system side (one-off procurement costs), because a high-precision positioning device is required. The second arrangement requires greater expenditure on each adapter, which has to be developed individually for each individual type of printed circuit board.

In a fully automatic test system, in which conveyance to the actual test adapter takes place by means of a control system which is able to monitor highly accurately the location of the test specimen during conveyance, alternative methods exist for measuring the displacement of the printed circuit on the printed circuit board relative to the holes therein. For example, the position of alignment marks can be measured in such a way that a reflection light barrier measures the reflectivity of the surface of the test specimen either directly or indirectly across a certain distance by a fiber-optic light guide. The degree of intensity measured during movement permits an accurate computer-aided calculation of displacement values. The degree of accuracy required of the conveyance means can also be reduced if a straight forward incremental measurement between the printed circuit board print and the holes is made. There can be provided, e.g., a hole in a preferably rectangular metal area (pad), during optical scanning of which an intensity profile is then obtained whose deviation from a predetermined profile or whose asymmetry mirrors very accurately the displacement values.

In order to become as independent as possible of contamination problems encountered in everyday production runs, use can also be made, instead of optical measurement, of mechanical scanning (pick-up). For example, a sapphire pin or a subminiature sapphire roll with a noise amplifier scans the surface of the printed circuit board. The edges of a metal area on the test specimen relative to support material or relative to a hole then give clearly differentiatable (sonar) pulse shapes whose symmetrical or asymmetrical position provides clear evidence of displacement (sonar pattern).

The measuring techniques described above provide the possibility, prior to the test run proper during which the printed circuit on the test specimen is verified by the contacting of possibly thousands of test pins, of carrying out a measurement of displacement. The result of such measurement is then used directly for the adjustment of alignment elements in the adapter, so that the adapter device is optimally positioned individually for each individual test specimen. This advantageous result is made possible by the measurement of the displacement values.

Should it be decided for economic reasons or because of reduced accuracy requirements not to use one of the above-mentioned methods, there is a further method which requires a small work-load, but can only be used "post factum". Use is made of the fact that the displacement values found within a single lot vary far less than those between lots (tracking production parameters). Within an adapter that is used for electrical testing there are accommodated, in addition to the test pins or contact elements that are required for the actual testing of the connection pattern or the printed circuit, further displacement test pins, which interact with a special "test pattern" or alignment marks on the printed circuit board. These additional displacement test pins are so arranged that they supply, in the event of an increase of displacement of the board patters, an increasingly varying displacement measurement result. Should one or more faults be discovered during electrical testing, there can be established by means of the separately recorded, additional displacement measurement result the direction, and in some cases a value, for the displacement correction required. After a corresponding mechanical adjustment of the alignment means in the adapter, the same printed circuit board is then tested once again. The additional displacement test pins introduced for displacement measurement moreover can be connected either to the conventional printed circuit board test set itself or to an external electronic unit and be evaluated by the latter. In special cases there will be addition be determined by means of the relationship with the mechanical displacement values the optimized position of the adapter relative to the test specimen. A structural combination of this external electronic evaluation unit with the mechanical control unit for adjusting the alignment means on the adapter makes a compact solution or assembly with user-friendly operation possible. This leads to a twin station with a Station A "Sensor" with the optical or electrical displacement measurement and a Station B "Tester" with the mechanical setting of the adapter based on the measurement result. The electric displacement sensor operates by means of alignment marks, including for pure SMD application, i.e. without mixed technology with subset displacement.

The adapter according to the invention can also be constructed for a mixed manufacturing technology by division (partitioning) of the guide element in the plane thereof, if the structures on the printed circuit board exhibit adequate geometric spacings.

We claim:

1. A method for adjusting the position of contact elements of an adapter employed for testing a substrate, thereby to ensure contact of said contact elements with respective contact areas of said substrate, said method comprising:

supporting a first number of said contact elements by a first support;

supporting a second number of said contact elements by a second support; and moving said first support and thereby said first number of said contact elements relative to said second support and said second number of said contact elements in a direction parallel to a plane of said substrate.

2. A method as claimed in claim 1, wherein said substrate comprises a printed circuit board.

3. A method as claimed in claim 1, wherein respective adapters are employed on each of opposite sides of said substrate.

4. A method as claimed in claim 1, wherein said contact elements of said first number of said contact elements extend through and are supported in holes in said first support, and said contact elements of said second number of said contact elements extend through and are supported in holes in said second support.

5. A method as claimed in claim 1, wherein said contact elements of said first number of said contact elements extend through and are accommodated in enlarged spaces in said second support, and said contact elements of said second number of said contact elements extend through and are accommodated in enlarged spaces in said first support, thereby enabling said relative moving.

6. A method as claimed in claim 1, wherein reference pins extend through and are supported by respective holes in said second support, and said reference pins fit in reference holes in said substrate.

7. A method as claimed in claim 1, wherein said contact elements of said first number of said contact elements are of smaller size than said contact elements of said second number of said contact elements.

8. A method as claimed in claim 1, wherein said first support is positioned closer to said substrate than is said second support.

9. A method as claimed in claim 1, wherein said contact elements of said first number of said contact elements contact pads on said substrate, and said contact elements of said second number of said contact elements extend into and contact plated holes formed in said substrate.

10. A method as claimed in claim 1, wherein said contact elements comprise test pins.

11. A method as claimed in claim 10, wherein said first and second supports comprise respective first and second guide plates, and said test pins extend through said guide plates.

12. A method as claimed in claim 11, wherein said test pins of said first number of said test pins extend through and are supported in holes in said first guide plate, and said test pins of said second number of said test pins extend through and are supported in holes in said second guide plate.

13. A method as claimed in claim 12, wherein said test pins of said first number of said test pins extend through and are accommodated in enlarged spaces in said second guide plate, and said test pins of said second number of said test pins extend through and are accommodated in enlarged spaces in said first guide plate, thereby enabling said relative moving.

14. A method as claimed in claim 13, wherein reference pins extend through and are supported by respective holes in said second guide plate, and said reference pins fit in reference holes in said substrate.

15. A method as claimed in claim 14, wherein said test pins of said first number of said test pins are of smaller size than said test pins of said second number of said test pins.

16. A method as claimed in claim 15, wherein said first guide plate is positioned closer to said substrate than is said second guide plate.

17. A method as claimed in claim 16, wherein said test pins of said first number of said test pins contact pads on said substrate, and said test pins of said second number of said test pins extend into and contact plated holes formed in said substrate.

18. A method as claimed in claim 1, wherein said adapter including said contact elements thereof are positioned on one side of said substrate.

19. An adapter to be employed in a testing apparatus for testing a substrate, said adapter comprising:
a plurality of contact elements to be brought into contact with contact areas of the substrate;
a first support supporting a first number of said contact elements;
a second support supporting a second number of said contact elements; and
said first support and thereby said first number of said contact elements being movable relative to said second support and thereby said second number of said contact elements in a direction to be parallel to a plane of the substrate.

20. An adapter as claimed in claim 18, wherein said contact elements of said first number of said contact elements extend through and are accommodated in enlarged spaces in said second support, and said contact elements of said second number of said contact elements extend through and are accommodated in enlarged spaces in said first support, thereby enabling said relative movement.

21. An adapter as claimed in claim 18, further comprising reference pins extending through and supported by respective holes in said second support and to fit in reference holes in the substrate.

22. An adapter as claimed in claim 18, wherein said contact elements of said first number of said contact elements are of smaller size than said contact elements of said second number of said contact elements.

23. An adapter as claimed in claim 18, wherein said first support is positioned relative to said second support to be closer to the substrate than is said second support.

24. An adapter as claimed in claim 18, wherein said contact elements comprise test pins.

25. An adapter as claimed in claim 24, wherein said first and second supports comprise respective first and second guide plates, and said test pins extend through said guide plates.

26. An adapter as claimed in claim 25, wherein said test pins of said first number of said test pins extend through and are supported in holes in said first guide plate, and said test pins of said second number of said test pins extend through and are supported in holes in said second guide plate.

27. An adapter as claimed in claim 26, wherein said test pins of said first number of said test pins extend through and are accommodated in enlarged spaces in said second guide plate, and said test pins of said second number of said test pins extend through and are accommodated in enlarged spaces in said first guide plate, thereby enabling said relative moving.

28. An adapter as claimed in claim 27, further comprising reference pins extending through and supported by respective holes in said second guide plate and to fit in reference holes in the substrate.

29. An adapter as claimed in claim 28, wherein said test pins of said first number of said test pins are of smaller size than said test pins of said second number of said test pins.

30. An adapter as claimed in claim 29, wherein said first guide plate is positioned relative to said second guide plate to be closer to the substrate than is said second guide plate.

31. An adapter as claimed in claim 19, wherein said contact elements of said first number of said contact elements extend through and are supported in holes in said first support, and said contact elements of said second number of said contact elements extend through and are supported in holes in said second support.

32. An adapter as claimed in claim 19, wherein members of said adapter including said contact elements and said first and second supports having a configuration and construction to enable all of said members to be positioned on one side of the substrate.

\* \* \* \* \*